United States Patent
Collins, III et al.

(10) Patent No.: US 7,768,754 B2
(45) Date of Patent: Aug. 3, 2010

(54) CERAMIC SUBSTRATE FOR LIGHT EMITTING DIODE WHERE THE SUBSTRATE INCORPORATES ESD PROTECTION

(75) Inventors: William David Collins, III, San Jose, CA (US); Jerome Chandra Bhat, San Francisco, CA (US)

(73) Assignees: Philips Lumileds Lighting Company, LLC, San Jose, CA (US); Koninklijke Philips Electronics N.V., Eindhoven (NL)

(*) Notice: Subject to any disclaimer, the term of this patent is extended or adjusted under 35 U.S.C. 154(b) by 402 days.

(21) Appl. No.: 11/848,055

(22) Filed: Aug. 30, 2007

(65) Prior Publication Data

US 2007/0297108 A1 Dec. 27, 2007

Related U.S. Application Data

(63) Continuation of application No. 10/787,657, filed on Feb. 25, 2004, now Pat. No. 7,279,724.

(51) Int. Cl.
H01L 29/22 (2006.01)
H01L 29/24 (2006.01)

(52) U.S. Cl. .............. 361/56; 257/98; 257/99; 257/100

(58) Field of Classification Search .......... 361/56; 257/98–100; 338/21
See application file for complete search history.

(56) References Cited

U.S. PATENT DOCUMENTS

| | | | |
|---|---|---|---|
| 3,679,950 A | 7/1972 | Rutt | |
| 3,725,836 A | 4/1973 | Wada et al. | |
| 3,743,897 A | 7/1973 | Harnden, Jr. | |
| 3,965,552 A | 6/1976 | Rutt | |
| 4,506,285 A | 3/1985 | Einzinger | |
| 5,176,772 A | 1/1993 | Ohtaki | |
| 5,235,310 A | 8/1993 | Cowman et al. | |
| 5,290,375 A | 3/1994 | Nagasaka et al. | |
| 5,540,884 A | 7/1996 | Chiao | |
| 5,874,378 A | 2/1999 | Ishida et al. | |
| 5,889,308 A | 3/1999 | Hong et al. | |
| 6,217,990 B1 | 4/2001 | Asai et al. | |
| 6,339,367 B1 | 1/2002 | Takehana | |
| 6,535,105 B2 | 3/2003 | Heistand, II et al. | |
| 2001/0043454 A1 | 11/2001 | Yoshii et al. | |
| 2002/0179914 A1 | 12/2002 | Sheu | |
| 2003/0043013 A1 | 3/2003 | Shiraishi et al. | |
| 2004/0222433 A1* | 11/2004 | Mazzochette et al. | 257/99 |

OTHER PUBLICATIONS

Lionel M. Levinson et al., "The physics of metal Oxide Varistors", Journal of Applied Physics, vol. 46, No. 3, Mar. 1975, pp. 1332-1341.
Mark Drabkin et al., "Improved Metal Oxide Varistor Packaging Technology For Transient Voltage Surge Suppressers (TVSS)", Improved MOV Packaging Technology for TVSS document, pp. 1-14.

(Continued)

*Primary Examiner*—Kenneth A Parker
*Assistant Examiner*—Joseph Nguyen

(57) ABSTRACT

A metal oxide varistor comprising one or more zinc oxide layers is formed integral to a ceramic substrate to provide ESD protection of a semiconductor device mounted to the substrate. The portion of the ceramic substrate not forming the varistor may be aluminum oxide, aluminum nitride, silicon carbide, or boron nitride. The varistor portion may form any part of the ceramic substrate, including all of the ceramic substrate.

10 Claims, 5 Drawing Sheets

OTHER PUBLICATIONS

Naoki Ohashi et al., "Synthesis of zinc oxide varistors with a breakdown voltage of three volts using an intergranular glass phase in the bismuth-boron-oxide system", Internet article downloaded on Dec. 11, 2003 from ttp://content.aip.org/APPLAB/v83//i23/4857_1.html, 1 page "Mulilayer Varistor—Over Voltage Protector", Internet paper downloaded on Dec. 11, 2003 from http://w.w.w.spkecl.com/htdoc/multilayer-varistor-over-voltage-protector.htm, pp. 1-3.

Transient Voltage Suppressors, AVX TransGuard® paper, pp. 1-13.

* cited by examiner

CERAMIC SUBSTRATE FOR LIGHT EMITTING DIODE WHERE THE SUBSTRATE INCORPORATES ESD PROTECTION

CROSS REFERENCE TO RELATED APPLICATIONS

This application is a continuation of application Ser. No. 10/787,657, filed Feb. 25, 2004 and incorporated herein by reference.

FIELD OF INVENTION

This invention relates to electrostatic discharge (ESD) protection of electronic devices and, more particularly, to ESD protection for a semiconductor chip (e.g., a light emitting diode) mounted on a ceramic substrate.

BACKGROUND

FIG. 1 is a cross-sectional view of a prior art light emitting diode (LED) package 10. Package 10 contains an LED chip 12 having cathode and anode contacts coupled, via metal interconnects 18, to metal pads 14 on a ceramic substrate 16. Metal vias 20 extend through substrate 16 and contact backside metal pads 22. The LED chip is encapsulated by epoxy 23. Package 10 is typically solder-mounted onto a printed circuit board or incorporated into another package. Such other package typically includes a lens, reflective walls, a base, and leads. The various metal interconnects in combination with the ceramic substrate 16 conduct heat from the LED chip 12 to the printed circuit board, which may include an additional heat sink.

LEDs are well known and are formed from semiconductor materials on a substrate. The LED chip 12 substrate material may be a semiconductor, a conductor, or an insulator.

LEDs can be damaged by high voltages from ESD. It is common to provide ESD protection for an LED, such as providing a separate ESD protection circuit in the LED package or on the printed circuit board. Providing a separate ESD protection circuit in the LED package may increase the size of the package and/or reduce the light-emitting area of the chip 12. Forming the ESD protection circuitry on the PC board or in the package also adds complexity in the manufacture of the PC board or package and thus adds cost to the circuit.

What is desirable is a technique for providing ESD protection without the need for forming ESD protection circuitry on the LED chip or as a separate element on the PC board or in the package.

SUMMARY

A metal oxide varistor comprising one or more zinc oxide layers is formed integral to a ceramic substrate. The portion of the ceramic substrate that is not the varistor may be typically formed of aluminum oxide, aluminum nitride, silicon carbide, or boron nitride. Metal oxide varistors are commonly used for transient voltage suppression. The fabrication techniques for metal oxide varistors are compatible with those used to form ceramic substrates.

Accordingly, an ESD protection circuit is provided for an LED chip, or any other type of semiconductor chip, without the need for forming the ESD protection circuitry on the chip or providing a separate ESD protection circuit in the package or external to the package.

DETAILED DESCRIPTION

Ceramic substrates are commonly used to provide a hermetic seal, electrical insulation, mechanical stability, and a conductive heat path for integrated circuits. Ceramic substrates are easy to form by mixing ceramic powder in a binder and casting it into the desired form. The ceramic grains may also be sintered under pressure to bind the grains together. Suitable metal patterns are then deposited on the formed ceramic substrate. Ceramic substrates typically comprise aluminum oxide, aluminum nitride, silicon carbide, or boron nitride particles.

ESD protection circuitry generally operates to create a low resistance path between its terminals when a high voltage is applied across its terminals. There are many types of ESD protection circuits. One such ESD protection circuit is a metal oxide varistor. When a power surge or voltage spike is sensed, the varistor's resistance rapidly decreases, creating an instant shunt path, thereby preventing the current spike from being discharged through the protected components. A varistor acts similarly to back-to-back zener diodes.

Figure 1:
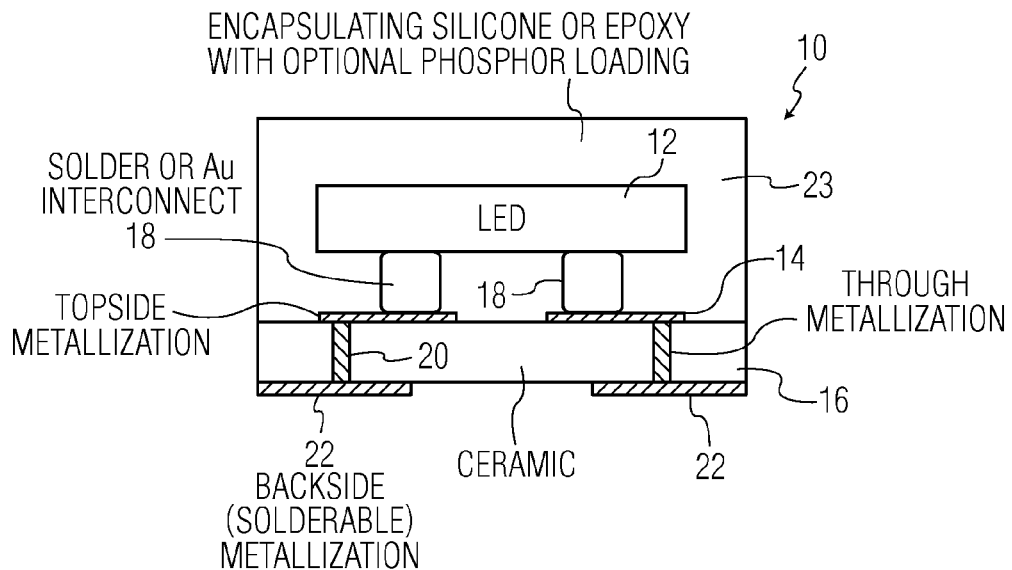
FIG. 1 is a cross-sectional view of a prior art surface-mounted LED package.
Figure 2:
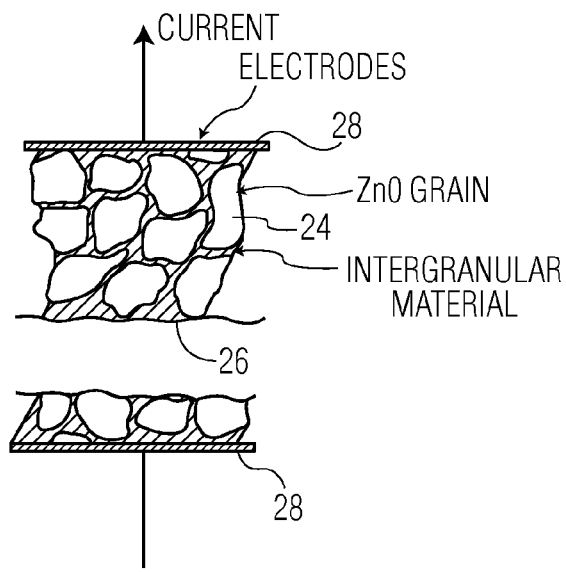
FIG. 2 is a cross-sectional view of a typical metal oxide varistor comprising zinc oxide grains.

FIG. 2 is a cross-section of a simple metal oxide varistor comprising zinc oxide grains 24 in a binder 26 sandwiched between two electrodes 28. The varistor is typically formed by mixing the zinc oxide grains with a binder and heating the grains under pressure to form a structure of conductive zinc oxide grains surrounded by electrically insulating barriers, creating varistor-like behavior. The number of grain-boundary interfaces between conducting electrodes determines the breakdown voltage of the device. High voltage applications require many grains between electrodes, while low voltage applications require few grains between the electrodes to establish the appropriate breakdown voltage. Varistors may be a single layer between electrodes or may be multiple layers, where each layer is sandwiched between opposing electrodes. The formation of zinc oxide varistors is well known.

The processing of these metal oxide varistors is compatible with the processing of standard ceramic substrates used for semiconductor chip packaging since the metal oxide is a ceramic. We use this compatibility to integrate the metal oxide varistor for ESD protection into the standard ceramic packaging. The range of integration ranges from the ceramic substrate having only a small portion forming the zinc oxide varistor to the substrate being completely formed by the zinc oxide varistor.

The same or similar elements in the various figures are assigned the same numeral.

Figure 3:
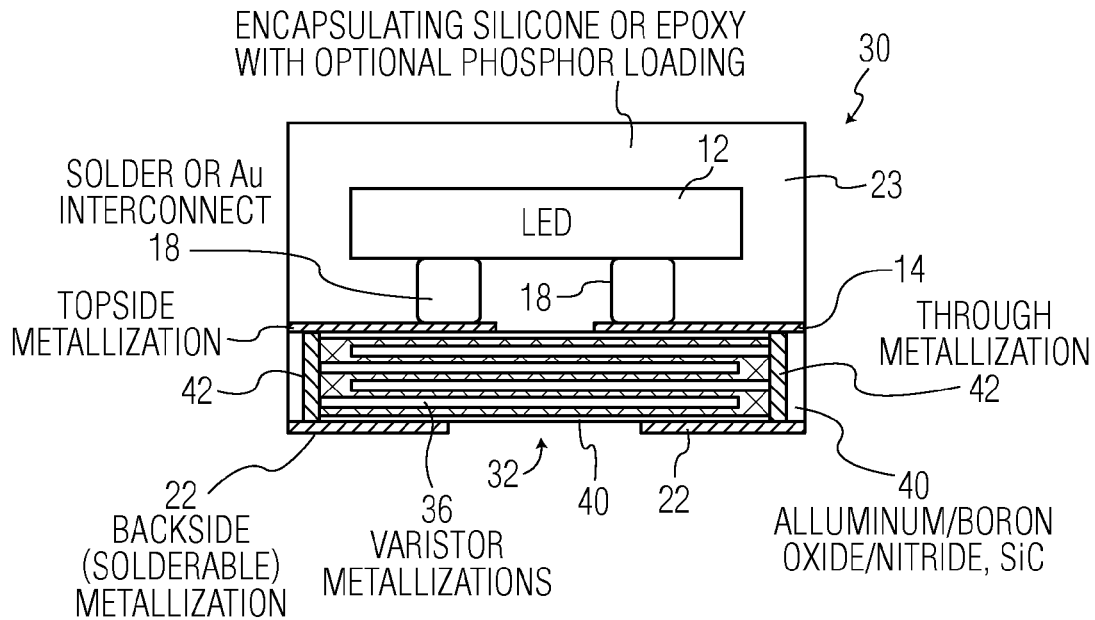
FIG. 3 is a cross-sectional view of an LED package incorporating a metal oxide varistor as an ESD protection circuit in the central portion of the ceramic substrate.

FIG. 3 is a cross-sectional view of an LED package 30 where a central portion of the substrate 32 is formed of doped zinc oxide 34 having metal layers 36 forming partially overlapping electrodes. The doping may be cobalt. The varistor structure may be formed by depositing (e.g., evaporating or sputtering) or laminating thin metal films upon layers of the zinc oxide grains in a binder and then using heat and pressure to form a stacked laminated structure. The varistor becomes a monolithic block during the heating cycle, providing uniform energy dissipation in a small volume.

The varistor portion of the substrate is surrounded by a conventional aluminum oxide, aluminum nitride, silicon carbide, or boron nitride ceramic substrate portion 40 for mechanical stability, hermetic sealing, and other properties. The ceramic substrate portion 40 may be formed by placing the varistor portion in a mold with aluminum oxide, aluminum nitride, silicon carbide, or boron nitride grains, then sintering the structure. Other techniques may be used.

The varistor portion can be made any size and thickness and may be completely surrounded (including the top and bottom surfaces) by the aluminum oxide, aluminum nitride, silicon carbide, or boron nitride ceramic substrate portion or have any or all of its sides exposed if the varistor provides the desired properties for the substrate.

A metallization step forms a metal via 42 extending from a top metal pad 14 to a bottom metal pad 22. The via 42 contacts the various varistor metal layers 36. The openings for the metal via may be formed during the molding process or may be drilled or etched.

The various heating, pressure, metal deposition, and other processes for forming the varistor and the aluminum oxide, aluminum nitride, silicon carbide, or boron nitride ceramic substrate are compatible. The zinc oxide varistor may be first formed, followed by forming the ceramic substrate around the varistor, followed by a metallization step. Or, the ceramic substrate may be first formed followed by forming the varistor. Or, the varistor and ceramic substrate can be formed at the same time. The same heating steps can be performed on both structures.

Solder or gold interconnects 18 are then provided over the metal pads 14. These interconnects may be solder balls, solder paste, stud-bumps, or a plated or otherwise deposited layer. In one embodiment, the surface mounted LED chip 12 is then mounted so that its bottom electrodes align with the solder interconnects, and the structure is heated to melt the interconnects and form an electrical and structural bond between the LED chip 12, the varistor/substrate, and the backside metal pads 22. In another embodiment, for bonding the LED chip 12 to the pads 14 through the use of gold interconnects, thermocompression bonding or thermosonic bonding would typically be used. An LED chip having both contacts on the bottom side is sometimes referred to as a flip chip.

The LED chip 12 is encapsulated using silicon or epoxy 23 with an optional phosphor powder incorporated into the encapsulation material if desirable for a particular light output.

The heat-sinking of the LED chip 12 occurs through the combination of the metal, the varistor/substrate, and the PC board.

Any voltage surge applied to a backside pad 22 will be shorted across pads 22 by the reduced resistance of the varistor so as to shunt the current away from the LED chip 12.

Figure 4:
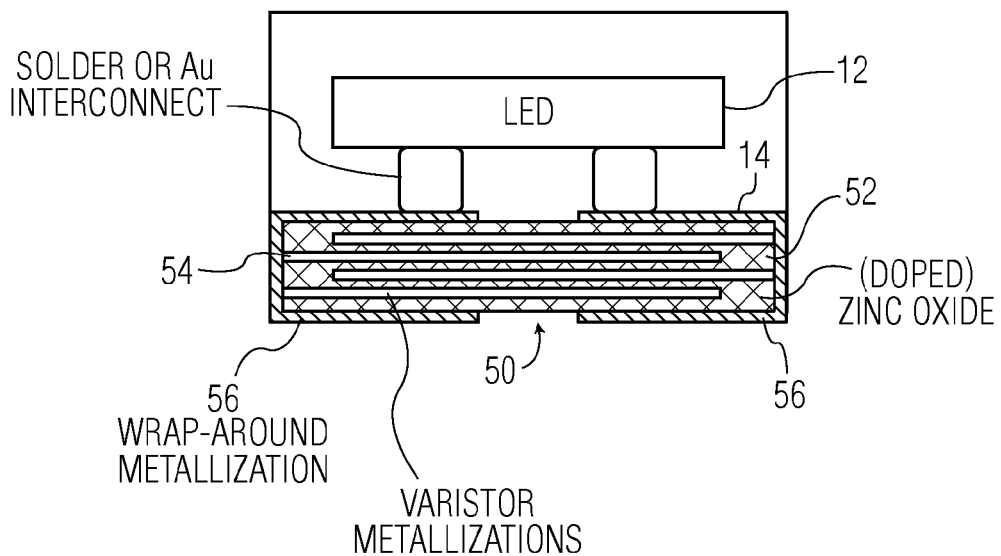
FIG. 4 is a cross-sectional view of another embodiment of an LED package where the varistor forms almost the entire ceramic substrate.

FIG. 4 is cross-sectional view of another embodiment of the invention where the entire ceramic substrate is a varistor 50 formed of doped zinc oxide 52 and metal layers 54. The varistor 50 is at least partially surrounded by wrap-around metallization 56, which provides mechanical stability, heat conductivity, and enhanced electrical properties. In the embodiment of FIG. 4, no through-metallization is required since the varistor metal layers 54 extend to the edge of the ceramic substrate.

Figure 5:
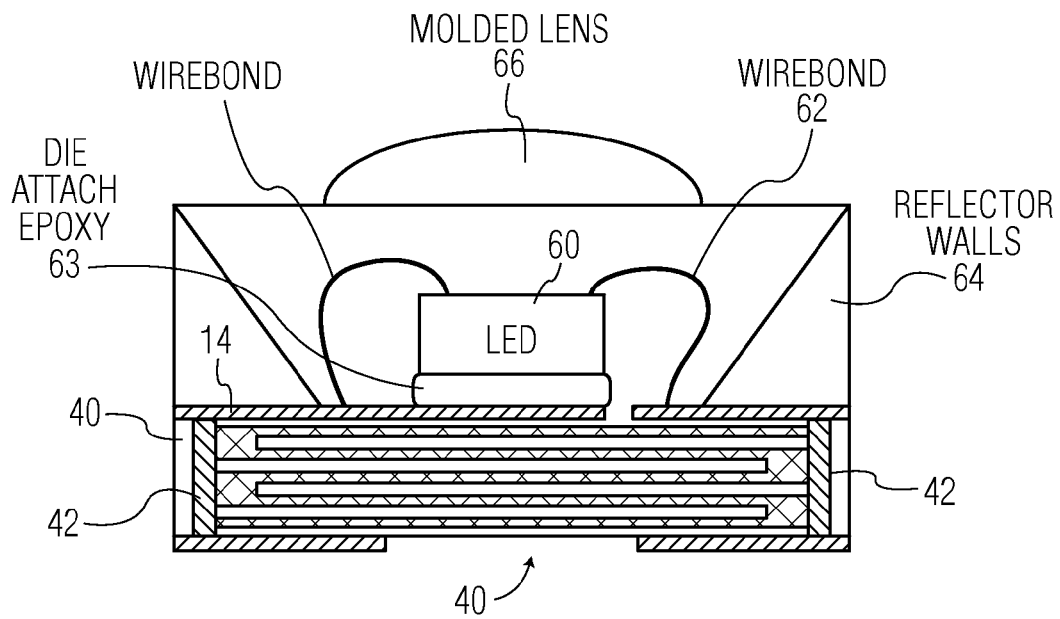
FIG. 5 is a cross-sectional view of an LED package where the LED chip electrodes are connected with wires to a ceramic substrate incorporating a metal oxide varistor.

FIG. 5 is a cross-section of another embodiment of an LED package similar to that of FIG. 3 except that the LED chip 60 is not a flip chip but has its contacts on a top surface, which are connected via wires 62 to the pads 14 of the ceramic substrate. The LED chip 60 is attached to a metal pad of the ceramic substrate by solder or die attach epoxy 63.

In the embodiment of FIG. 5, a reflector 64 surrounds the LED chip 60 to reflect light through the top surface of the package. The reflective walls may be a refractive interface between two materials, a refractive index step from one encapsulant to another or to air, or a reflective metal slope. The reflective walls may also be formed by the ceramic material. For example, aluminum oxide is white and can thus act as a reflector and a diffuser. A molded lens 66 is formed over the LED chip 60.

Figure 6:
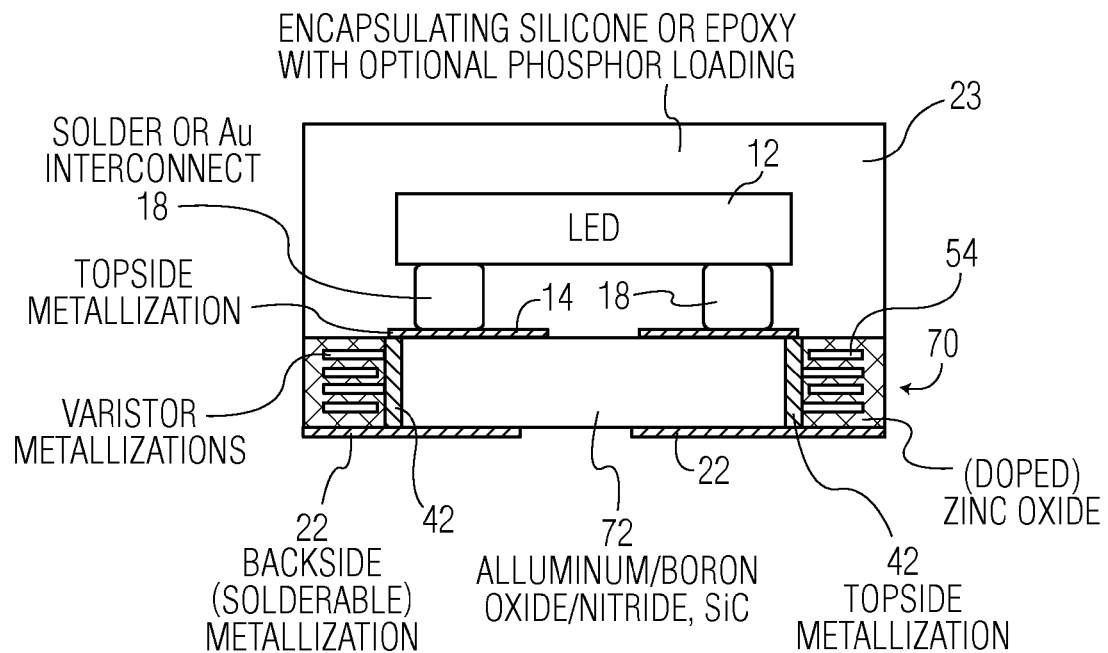
FIG. 6 is a cross-sectional view of another embodiment of an LED package where the ceramic substrate incorporates a metal oxide varistor around a periphery of the substrate.

FIG. 6 is a cross-sectional view of another embodiment of the invention where the varistor 70 is formed along at least a portion of the outer surface of the aluminum oxide, aluminum nitride, silicon carbide, or boron nitride ceramic substrate 72. The varistor portion of the substrate may be formed along any portion of the aluminum oxide, aluminum nitride, silicon carbide, or boron nitride substrate. The metal layers 54 in the varistor alternately contact the two metal vias 42. Additional vias may be provided as desired.

Figure 7:
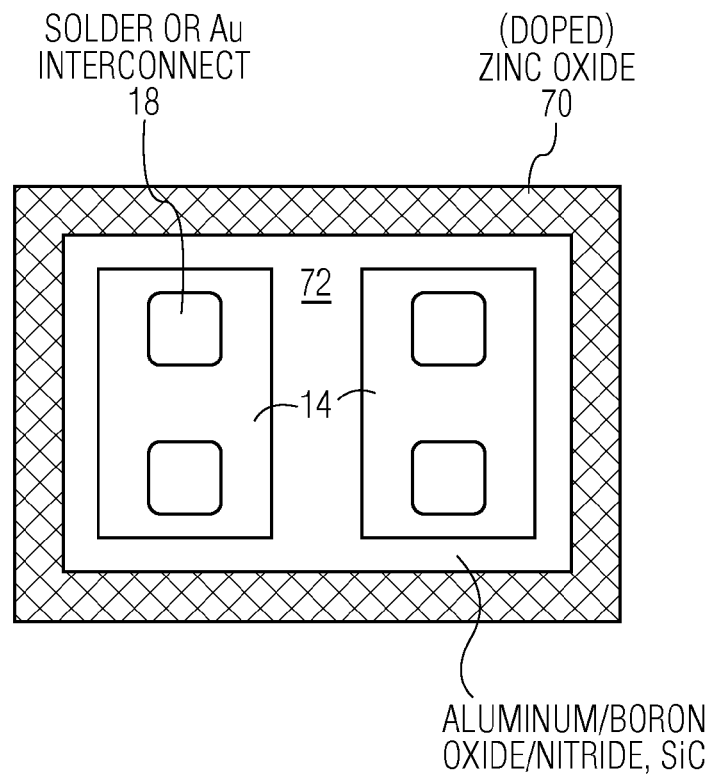
FIG. 7 is a top-down view of the structure of FIG. 6.

FIG. 7 is a top-down view of the structure of FIG. 6 showing that the varistor 70 portion completely surrounds the outer perimeter of the aluminum oxide, aluminum nitride, silicon carbide, or boron nitride substrate 72. Also shown are metal interconnects 18 for the anode and cathode terminals of the LED chip 12 coupled to metal pads 14. Four contacts are used for reproducible orientation of the chip 12 on the substrate.

Figure 8:
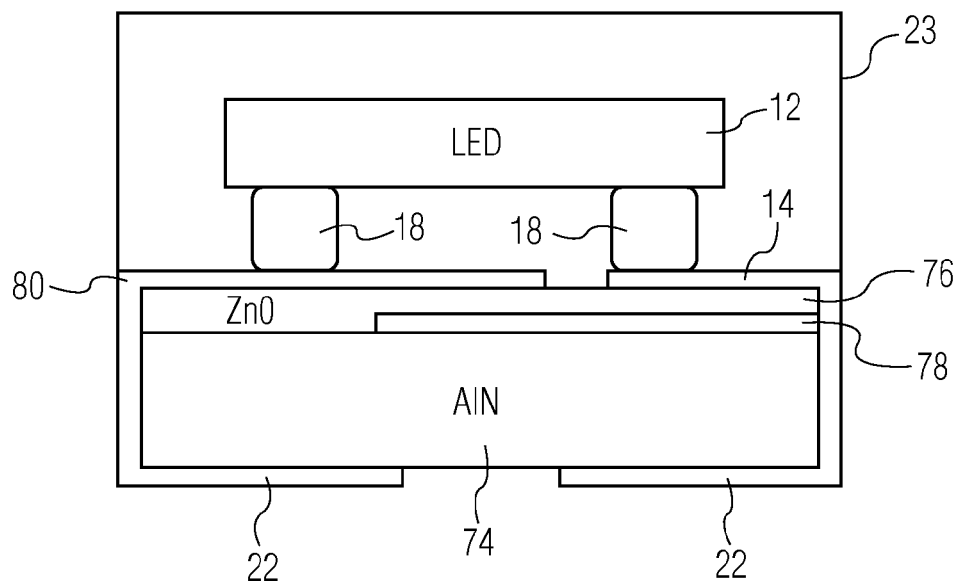
FIG. 8 is a cross-sectional view of another embodiment of an LED package where the substrate incorporates a zinc oxide varistor as a top layer of the substrate and where the zinc oxide is sandwiched between two varistor electrodes.

FIG. 8 is a cross-section of another embodiment of the invention where an aluminum nitride, aluminum oxide, silicon carbide, or boron nitride ceramic substrate 74 portion has formed on top of it a zinc oxide varistor 76 having a bottom metal layer 78 and an upper metal layer 80. Metal layers 78 and 80 are electrically coupled to contacts on the LED chip 12 and to the bottom metal pads 22. The varistor presents a low resistance path between metal layers 78 and 80 when a voltage surge is applied across metal pads 22. The varistor could also be formed on the bottom of the substrate.

The embodiment of FIG. 8 is simple to form because the zinc oxide material is a single layer formed on top of the aluminum oxide, aluminum nitride, silicon carbide, or boron nitride substrate 74. The zinc oxide varistor may form any portion of the top or bottom surface of the ceramic substrate. The ceramic substrate 74 portion may be a conventional rectangular substrate. If desirable, additional metal layers may be interdigitated within the zinc oxide layer.

Figure 9:
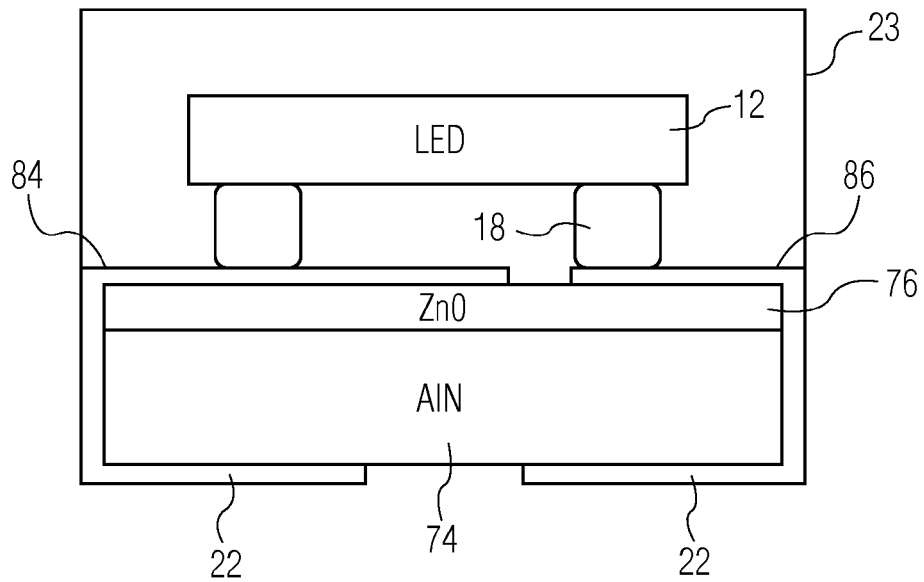
FIG. 9 is a cross-sectional view of another embodiment of an LED package where the substrate incorporates a zinc oxide varistor as a top layer of the substrate and where the varistor electrodes are formed on a top surface of the zinc oxide layer.

FIG. 9 illustrates another embodiment of the invention, similar to FIG. 8, except that the metal layers 84 and 86 for the varistor 76 are formed on an upper surface of the zinc oxide layer so the varistor breaks down across the top surface between the ends of the two metal layers. A large breakdown voltage may be achieved with a thin zinc oxide layer. Another advantage of the structure of FIG. 9 is that the metal can be applied after the substrate has been completely manufactured such as by screen printing and firing. The varistor may also be formed on the bottom surface of the substrate.

Figure 10:
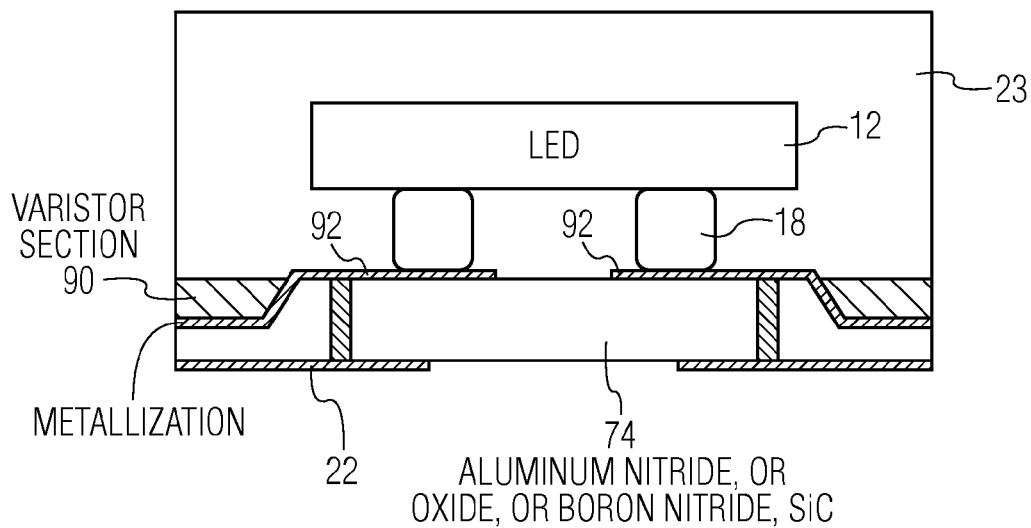
FIG. 10 is a cross-sectional view of another embodiment of an LED package where the substrate incorporates a zinc oxide varistor as a top layer of the substrate along the outer portions of the substrate.

FIG. 10 illustrates another embodiment of the invention where the varistor 90 is formed on a top surface of the aluminum oxide, aluminum nitride, silicon carbide, or boron nitride ceramic substrate portion only near the edge of the substrate. The varistor may be formed along any number of sides of the substrate. The metal layer portions 92 are deposited on top of the ceramic substrate 74, and the varistor material is then formed over the metal layer portions 92. In one embodiment, the varistor material on the left side of FIG. 10 is continuous with the varistor material on the right side of FIG. 10, and the varistor breaks down between the two metal layer portions 92. In another embodiment, other electrode metal layer(s) for the varistor may be formed over the varistor material or may be formed as interdigitated metal layers in the varistor material so the varistor breaks down vertically instead of horizontally.

The varistor portion of FIG. 10 may also be formed on a bottom surface of the substrate.

The various packages described herein may be incorporated into another package. Such other package will typically include a lens, reflective walls, a base, and leads for connection to a PC board. Alternatively, the ceramic substrate incorporating the varistor may be directly attached to the PC board. Additionally, the LED chip may be directly mounted on a submount, such as a semiconductor chip with conductive traces and active components, and the submount is then mounted to the ceramic substrate incorporating the varistor.

The patterning of the metal layers contacting the zinc oxide may be used to select the desired breakdown voltage of the varistor for any of the embodiments described herein. The zinc oxide grains and other properties of the zinc oxide layer may also be adjusted to achieve a desired breakdown voltage.

Although the ceramic substrate incorporating a metal oxide varistor has been shown for supporting and protecting an LED chip, the ceramic substrate may be used to protect any type of chip, such as a conventional integrated circuit chip. Various forms of the varistor may be incorporated using any pattern of electrodes and any shape of the varistor, using up any substrate volume. Multiple varistors can be connected in series and/or parallel.

Although a varistor comprising zinc oxide has been described, varistors may be formed of other metal oxides or a combination of such oxides with zinc oxide. Examples of other oxides include $Sb_2O_3$, $Bi_2O_3$, $CoO$, $MnO$, and $Cr_2O_3$. Metal oxide varistors are described in more detail in the publication, "The Physics of Metal Oxide Varistors," by Levinson and Philipp, Journal of Applied Physics, Volume 46, No. 3, March 1975, incorporated herein by reference. Those skilled in the art of manufacturing ceramic substrates will be able to form any of the embodiments described herein without undue experimentation since the methods of forming aluminum oxide, aluminum nitride, silicon carbide, and boron nitride substrates and metal oxide varistors are well known.

Further information regarding metal oxide varactors is described in the article entitled "Improved Metal Oxide Varistor Packaging Technology for Transient Voltage Surge Suppressers (TVSS)," by Drabkin et al., incorporated herein by reference.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is claimed is:

1. A device comprising:
    a ceramic substrate having a top surface and a bottom surface, the ceramic substrate providing electrostatic discharge (ESD) protection of a semiconductor device mounted over the top surface,
        the ceramic substrate comprising a first layer containing a first metal oxide, a first surface of the first layer being the top surface of the ceramic substrate, the first layer forming a metal oxide varistor that provides electrostatic discharge (ESD) protection of the semiconductor device mounted over the first surface of the first layer,
        the ceramic substrate also comprising a second layer containing a ceramic second material that does not contain any first metal oxide, the second layer not forming a varistor, a second surface of the second layer forming the bottom surface of the ceramic substrate;
    a first metal layer overlying a portion of the first surface of the first layer;
    a second metal layer in contact with the first layer between the first layer and the second layer;
    a first electrode area electrically coupled to the first metal layer to which a first electrode of the semiconductor device is electrically connected when mounted over the first surface;
    a second electrode area electrically coupled to the second metal layer to which a second electrode of the semiconductor device is electrically connected when mounted over the first surface,
    whereby the first metal layer, the first layer, and the second metal layer form a low resistance path between the first electrode area and the second electrode area when a voltage between the first electrode area and the second electrode area exceeds a threshold.

2. The device of claim 1 wherein the first metal oxide- comprises zinc oxide, and wherein the second material comprises one of aluminum oxide, aluminum nitride, silicon carbide, or boron nitride.

3. The device of claim 1 wherein the first metal layer and the second metal layer overlap with the first layer therebetween.

4. The device of claim 1 further comprising a third electrode area electrically connected to the first electrode area, the third electrode area formed on the bottom surface of the ceramic substrate for connection to a power source.

5. The device of claim 4 further comprising a fourth electrode area electrically connected to the second electrode area, the fourth electrode area formed on the bottom surface of the ceramic substrate for connection to the power source.

6. The device of claim 5 further comprising a first metal portion along a side of the ceramic substrate coupling the first electrode area to the third electrode area, and further comprising a second metal portion along another side of the ceramic substrate coupling the second electrode area to the fourth electrode area.

7. The device of claim 1 wherein there is only a single layer containing the first metal oxide.

8. The device of claim 1 wherein the varistor comprises ceramic grains at least partially sandwiched between the first metal layer and the second metal layer.

9. The device of claim 1 further comprising a light emitting diode (LED) chip mounted on the top surface of the ceramic substrate and being protected from ESD by the varistor.

10. The device of claim 1 wherein the varistor forms part of a heat conduction path between the semiconductor device and a printed circuit board over which the ceramic substrate is mounted.

\* \* \* \* \*